(12) United States Patent
Hanson et al.

(10) Patent No.: US 9,147,443 B2
(45) Date of Patent: Sep. 29, 2015

(54) LOW POWER REFERENCE CURRENT GENERATOR WITH TUNABLE TEMPERATURE SENSITIVITY

(75) Inventors: Scott Hanson, Austin, TX (US); Dennis Sylvester, Ann Arbor, MI (US); David Blaauw, Ann Arbor, MI (US)

(73) Assignee: The Regents Of The University of Michigan, Ann Arbor, MI (US)

( * ) Notice: Subject to any disclaimer, the term of this patent is extended or adjusted under 35 U.S.C. 154(b) by 0 days.

(21) Appl. No.: 13/472,870

(22) Filed: May 16, 2012

(65) Prior Publication Data

US 2012/0293212 A1   Nov. 22, 2012

Related U.S. Application Data

(60) Provisional application No. 61/488,169, filed on May 20, 2011, provisional application No. 61/501,378, filed on Jun. 27, 2011.

(51) Int. Cl.
*H02M 11/00* (2006.01)
*G11C 5/14* (2006.01)
*G05F 1/56* (2006.01)
*G05F 3/24* (2006.01)

(52) U.S. Cl.
CPC ............... *G11C 5/147* (2013.01); *G05F 1/561* (2013.01); *G05F 3/242* (2013.01)

(58) Field of Classification Search
USPC ........................................................ 327/103
See application file for complete search history.

(56) References Cited

U.S. PATENT DOCUMENTS

| | | | |
|---|---|---|---|
| 5,031,907 A | 7/1991 | Warehime | |
| 5,061,907 A | 10/1991 | Rasmussen | |
| 5,668,483 A | 9/1997 | Roohparvar | |
| 6,034,519 A * | 3/2000 | Yang | 323/316 |
| 6,069,503 A * | 5/2000 | Doyle | 327/103 |
| 6,351,178 B1 * | 2/2002 | Ooishi et al. | 327/541 |
| 6,563,372 B1 * | 5/2003 | Fournel | 327/543 |
| 6,628,161 B2 * | 9/2003 | Ikeda | 327/538 |
| 6,937,088 B2 * | 8/2005 | Hamamoto et al. | 327/541 |
| 6,992,518 B2 * | 1/2006 | Lundberg | 327/206 |
| 7,113,026 B2 * | 9/2006 | Yamahira | 327/540 |
| 7,768,324 B1 | 8/2010 | Limotyrakis | |
| 7,903,011 B2 * | 3/2011 | Werking | 341/144 |
| 2004/0217783 A1 * | 11/2004 | Gee | 327/112 |

(Continued)

FOREIGN PATENT DOCUMENTS

JP   H01218211 A   8/1989

OTHER PUBLICATIONS

S. Ramasamy, A low power programmable band gap reference circuit with subthreshold MOSFETS, TENCON 2008.*
B. Razavi, "Design of Analog CMOS Integrated Circuits", McGraw-Hill Higher Education, New York, NY (2001), pp. 150 and 355.

*Primary Examiner* — Lincoln Donovan
*Assistant Examiner* — Patrick Chen
(74) *Attorney, Agent, or Firm* — Harness, Dickey & Pierce, P.L.C.

(57) ABSTRACT

An improved reference current generator is provided. A voltage difference generator generates two voltages that are separated by a relatively small electrical potential. The two closely separated voltages are applied across a resistive element with relatively large impedance value resulting in a small and stable reference current. The result is a power efficient, temperature compensated reference current generator.

28 Claims, 3 Drawing Sheets

(56) References Cited

U.S. PATENT DOCUMENTS

| | | |
|---|---|---|
| 2008/0297234 A1 | 12/2008 | Moholt et al. |
| 2009/0135036 A1 | 5/2009 | Werking |
| 2009/0289614 A1* | 11/2009 | Tu et al. ............... 323/313 |
| 2010/0246283 A1 | 9/2010 | Hirota |
| 2010/0327842 A1 | 12/2010 | Seok et al. |

* cited by examiner

LOW POWER REFERENCE CURRENT GENERATOR WITH TUNABLE TEMPERATURE SENSITIVITY

CROSS-REFERENCE TO RELATED APPLICATIONS

This application claims the benefit of U.S. Provisional Application No. 61/488,169 filed May 20, 2011 and U.S. Provisional Application No. 61/501,378 filed Jun. 27, 2011. The entire disclosures of each of the above applications are incorporated herein by reference.

FIELD

The present invention relates generally to current reference circuits used in integrated circuits, and, in particular, integrated circuit topologies that support power reduction.

BACKGROUND

In general, in the descriptions that follow, we will italicize the first occurrence of each special term of art that should be familiar to those of ordinary skill in the art of low power current reference design. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Power consumption has become a key problem for circuit designers with the proliferation of battery-powered devices. Circuit topologies that support power reduction are extremely valuable in extending battery life. Reference current generators are present in virtually any integrated circuit since all analog electronics require a bias current for proper operation. This reference current is also generally temperature-compensated such that the current is substantially insensitive to temperature or proportional to absolute temperature ("PTAT") or complementary to absolute temperature ("CTAT"). Most reference current generators draw significant power due to the heavy use of saturated transistors and relatively small resistors.

Reference currents can be generated in a wide variety of ways. Two prior art examples are shown in FIG. 1 and FIG. 2. In one such prior art example of a reference current generator circuit 10, shown in FIG. 1, a voltage from a reference voltage generator (e.g., a bandgap reference voltage generator) 12 can be amplified using buffer 14 and applied across resistor 16. Bandgap reference 12 and resistor 16 are both reasonably temperature insensitive and can be tuned to achieve a desired temperature sensitivity (e.g., zero temperature sensitivity, PTAT, CTAT). However, reference current generator circuit 10 consumes considerable power. Voltage generator 12 draws significant power; nominally on the order of one microamp (1 µA). The combination of a large voltage combined with a relatively small resistor results in excessive current draw. Assuming a typical bandgap reference voltage of 1.25V and a typical on-chip resistor of 100 kΩ, reference current generator circuit 10 consumes a reference current of 1.25/100e3=12.5 µA. This current is well in excess of limits imposed by many modern battery-powered devices.

Similarly, the structure shown in FIG. 2 is also typical in that good temperature sensitivity can be achieved. However, the active devices in reference current generator circuit 18 are operated in the saturation region and will typically draw much more than 1 µA of current.

Given the wide use of current reference generators and the significant power demands of these circuits, we submit that what is needed is an improved method and apparatus for an ultra-low power temperature compensated reference current generator. Such a method and apparatus is important for use in power sensitive systems such as battery-powered electronics.

SUMMARY

In accordance with a preferred embodiment of our disclosure, we provide a circuit for generating a reference current, the circuit including a voltage difference generator adapted to supply a first voltage and a second voltage. The voltage difference generator includes a reference voltage generator adapted to supply a first supply voltage. The voltage difference generator also includes a voltage buffer amplifier electrically coupled to the first supply voltage, and is adapted to provide a second supply voltage. The voltage difference generator also includes a voltage ladder electrically coupled to the second supply voltage, and is adapted to supply the first voltage and the second voltage. The circuit for generating a reference current also includes a first buffer electrically coupled to the first voltage. The first buffer is adapted to supply a third voltage. The first buffer includes a first amplifier adapted to receive the first voltage and the third voltage, and to compare the first voltage to the third voltage. In response to the comparison, the first amplifier outputs a first control voltage. The first buffer also includes a first transistor device adapted to receive the first control voltage, and, in response, to supply the third voltage. The circuit for generating a reference current also includes a second buffer electrically coupled to the second voltage. The second buffer is adapted to supply a fourth voltage. The second buffer includes a second amplifier. The second amplifier is adapted to receive the second voltage and the fourth voltage, and to compare the second voltage to the fourth voltage. In response to the comparison, the second amplifier outputs a second control voltage. The second buffer also include a second transistor device adapted to receive the second control voltage, and, in response, to supply the fourth voltage. The circuit for generating a reference current also includes a resistive element electrically coupled between the third voltage and the fourth voltage. The resistive element is adapted to generate a reference current that is a function of the third voltage and the fourth voltage.

In one other embodiment, we provide a circuit for generating a reference current that includes a voltage difference generator. The voltage difference generator is adapted to supply a first voltage and a second voltage. The circuit for generating a reference current also includes a first buffer electrically coupled to the first voltage. The first buffer is adapted to supply a third voltage. The circuit for generating a reference current also includes a second buffer electrically coupled to the second voltage. The second buffer is adapted to supply a fourth voltage. The circuit for generating a reference current also includes a resistive element electrically coupled between the third voltage and the fourth voltage. The resistive element is adapted to generate a reference current that is a function of the third voltage and the fourth voltage.

We submit that each of these embodiments of our disclosure provide for an ultra-low power temperature compensated reference current generator, the performance being generally comparable to the best prior art techniques while requiring less circuitry and consuming less power than known implementation of such prior art techniques.

DRAWINGS

The drawings described herein are for illustrative purposes only of selected embodiments and not all possible implementations, and are not intended to limit the scope of the present disclosure.

Figure 1:
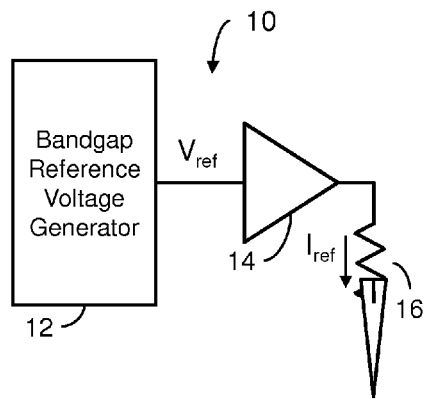
FIG. 1 illustrates, in block diagram form, an embodiment of a prior art reference current generator circuit.
Figure 2:
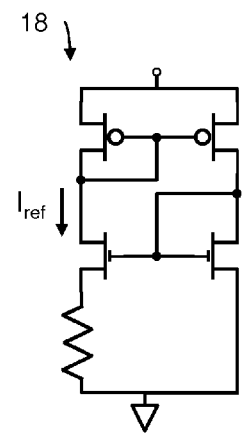
FIG. 2 illustrates, in block diagram form, another embodiment of a prior art reference current generator circuit.

In the drawings, similar elements will be similarly numbered whenever possible. However, this practice is simply for convenience of reference and to avoid unnecessary proliferation of numbers, and is not intended to imply or suggest that our disclosure requires identity in either function or structure in the several embodiments.

DETAILED DESCRIPTION

A new reference current generator is described that draws significantly less power (e.g., on the order of 10-1000 times less) than existing current reference generators while still achieving outstanding temperature compensation. The prior art approaches described earlier in this application are able to achieve excellent temperature sensitivity. However this achievement comes at the expense of dissipating power in excess of the low power needs of ultra-low power integrated circuits with current budgets on the order of nanoamps. A new reference current generator topology is disclosed that achieves minimum power while still maintaining excellent temperature sensitivity. Like the architecture illustrated in FIG. 1, our new reference current generator applies a voltage across a resistive element to generate a reference current.

However, instead of generating a relatively large voltage to apply across a relatively small resistor (which results in high current draw), the new reference current generator supplies two voltages that are relatively close in value and applies these voltages across a resistive element with a relatively high impedance value (e.g., greater than 1 MΩ). The application of a relatively small voltage difference across a resistive element of a relatively large value provides much improved power efficiency.

Figure 3:
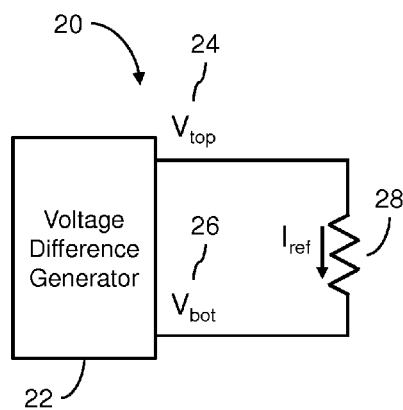
FIG. 3 illustrates, in block diagram form, an embodiment of the reference current generator circuit according to the disclosure.

In accordance with an embodiment of our disclosure, FIG. 3 presents a block diagram illustrating a reference current generator 20. Reference current generator 20 includes voltage difference generator 22 that generates two closely separated voltages labeled in FIG. 3 as $V_{top}$ 24 and $V_{bot}$ 26. These two voltages, $V_{top}$ 24 and $V_{bot}$ 26, are applied across resistive element 28 producing the desired reference current, labeled $I_{ref}$ in FIG. 3. As an example, assume that the voltages generated by voltage difference generator 22 are at two different potentials separated by 10 mV. Assume further that resistive element 28 has an impedance value of 50MΩ. Under these circumstances, reference current generator 20 produces a relatively small reference current, $I_{ref}$, of 200 picoamps (200 pA), calculated as 0.01 V/50e6Ω.

Figure 4:
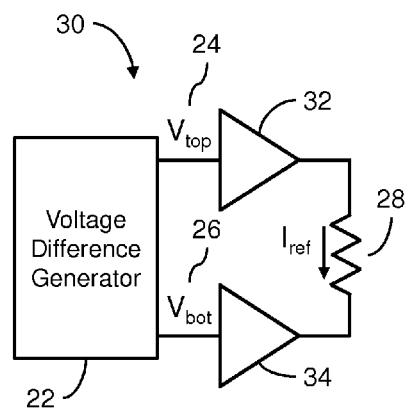
FIG. 4 illustrates, in block diagram form, another embodiment of the reference current generator circuit according to the disclosure.
Figure 8:
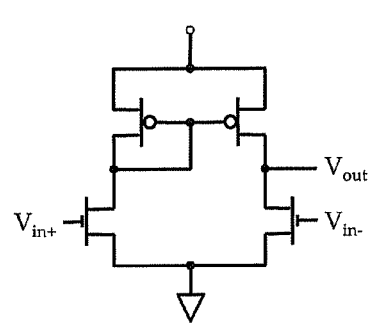
FIG. 8 illustrates, in block diagram form, a known common drain amplifier suitable for use in the several embodiments of my reference current generator.

Similarly, in accordance with another embodiment of our invention, FIG. 4 presents a block diagram illustrating a reference current generator 30. Reference current generator 30 includes voltage difference generator 22. As in the embodiment in FIG. 3, voltage difference generator 22 generates two closely separated voltages labeled in FIG. 4 as $V_{top}$ 24 and Vbot 26. These two closely separated voltages, $V_{top}$24 and $V_{bot}$26, are buffered by top buffer 32 and bottom buffer 34. The resulting output voltages from top buffer 32 and bottom buffer 34 are applied across resistive element 28 producing the desired reference current, labeled $I_{ref}$ in FIG. 4. Design techniques for the voltage buffer amplifier, buffer top 32 and buffer bottom 34, are well known to one of ordinary skill in this art. Exemplary alternatives may include a circuit such as a common drain amplifier, also known as a source follower and illustrated in FIG. 8, or a more complex circuit such as a differential amplifier connected in a unity gain configuration. However, in order to minimize power, it is typically desirable to use circuit topologies with sub-threshold-biased transistors. Likewise, for isolation and performance reasons, it is typically desirable to use circuits with high impedance inputs and low impedance outputs typically associated with these types of buffer amplifiers. A more detailed discussion regarding the design of voltage difference generator 22 and resistive element 28 can be found in the subsequent sections.

Figure 5:
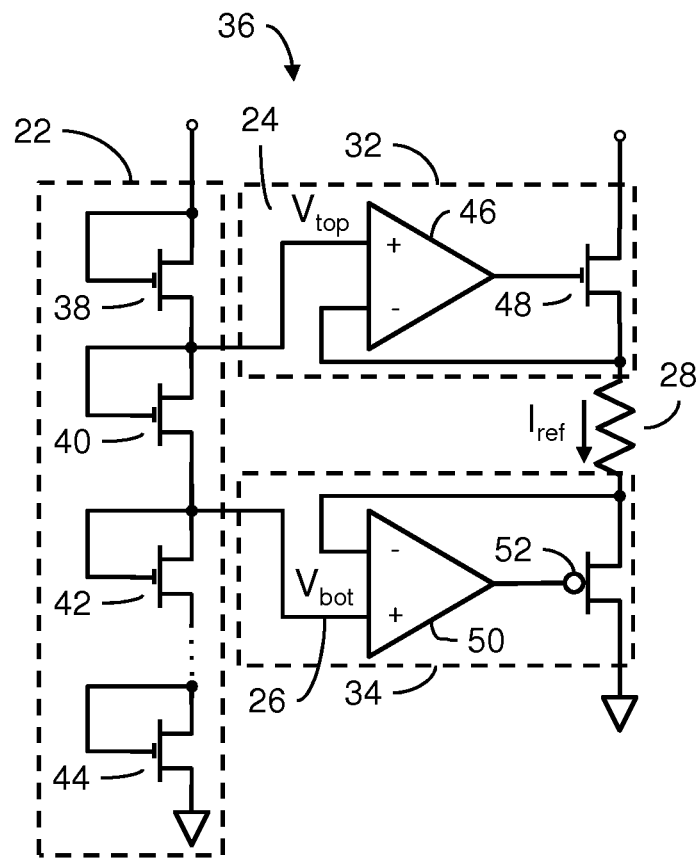
FIG. 5 illustrates, in block diagram form, a more detailed implementation of the reference current generator circuit according to the disclosure illustrated in FIG. 4.

FIG. 5 illustrates an exemplary implementation of the embodiment of our reference current generator found in FIG. 4 in more detail. Reference current generator 36 includes voltage difference generator 22. Voltage difference generator 22 generates two closely separated voltages, $V_{top}$ 24 and $V_{bot}$ 26, and does so with minimal power dissipation. Depending upon the application and the context, closely separated voltages may be characterized as voltage potentials differing within a range of between about 1 millivolt and 1 volt, and preferably between about 5 millivolts and 500 millivolts. By way of example, a first-generation prototype of an oscillator includes a voltage difference generator 22 with closely separated voltages in the range of 20 millivolts to 50 millivolts. The two closely separated voltages, $V_{top}$ 24 and $V_{bot}$ 26, are generated from two selected nodes of a plurality of series-connected resistive elements. This voltage ladder, constructed as a stack of series-connected resistive circuit elements such as resistors, can generate a plurality of voltages that are at potentials that differ by mere millivolts. However, the required resistors for achieving the desired voltage difference would be prohibitively large and impractical using modern semiconductor technology and techniques. Consider, for example, a supply voltage of 1.8V and a target current budget of 100 pA for the voltage ladder. In this exemplary case, the total resistance for a stack of series connected resistors must be 18GΩ. In a current 0.18 μm manufacturing process, such a resistor would require greater than 100 mm² of chip area.

Instead, we prefer to implement the voltage ladder as a series-connected stack of diode-connected transistors, illustrated in FIG. 5 as NMOS devices 38, 40, 42, and 44. As indicated by the ellipsis between NMOS device 42 and NMOS device 44, additional diode-connected transistors may be placed in the series connected stack in order to adjust the selected voltages to the desired potential. In the illustrated embodiment, voltage $V_{top}$ 24 is the voltage potential developed on the node between NMOS transistor 38 and NMOS transistor 40. Similarly, voltage $V_{bot}$ 26 is the voltage potential developed on the node between NMOS transistor 40 and NMOS transistor 42. The use of the series-connected stack of diode-connected transistors to generate $V_{top}$ 24 and $V_{bot}$ 26 is important since it ensures that the voltage difference between $V_{top}$ 24 and $V_{bot}$ 26 is relatively small. It also ensures that the voltage value for $V_{top}$ 24 is greater than the voltage value for $V_{bot}$ 26. Other tap points may be used, depending on the requirements and specification of a particular implementation in a particular context. In order to minimize power, it is typically desirable to use circuit topologies with sub-threshold-biased transistors. One of ordinary skill in the art will recognize, however, that similar circuit topologies may be implemented without sub-threshold-biased transistors, albeit without the implicit minimization of power. As is known, the internal node voltages of a stack of sub-threshold-biased, diode-connected transistors are temperature insensitive if all devices are substantially identical. Further, the internal node voltages can be made PTAT or CTAT by resizing the devices in the series-connected stack, thus simplifying the temperature compensation process. Additionally, it is desirable to generate $V_{top}$ 24 and $V_{bot}$ 26 using similar circuit structures rather than separate structures, thus ensuring they directly track one another across process variations, temperature variations, and voltage variations found in the manufacturing process. The use of PMOS devices is a viable alternative implementation for the diode stack.

Figure 7:
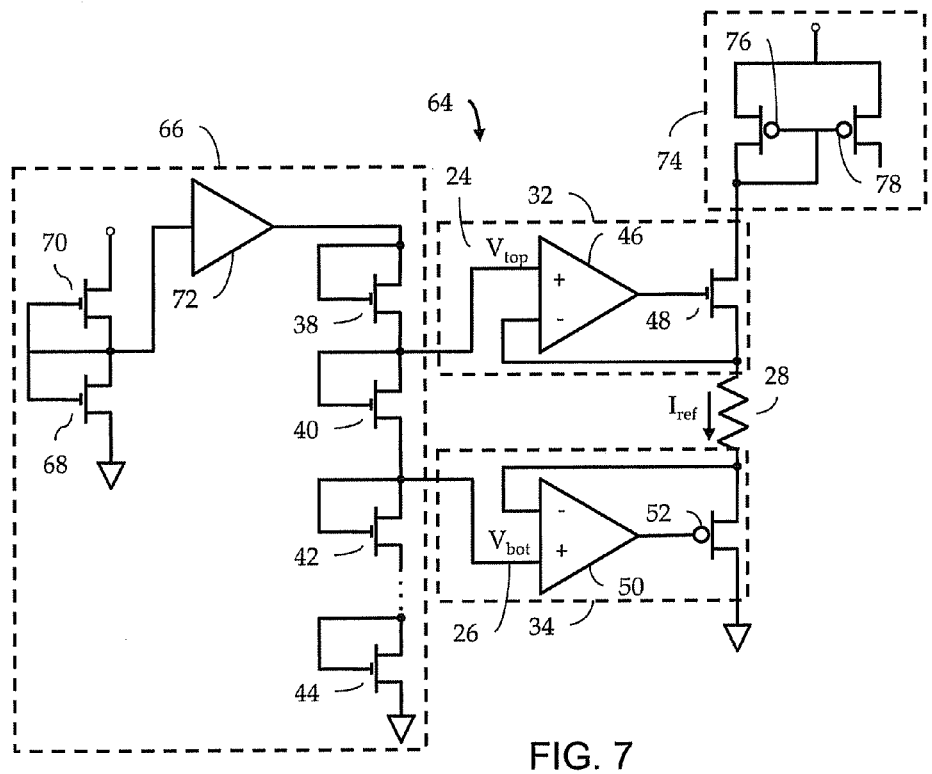
FIG. 7 illustrates, in block diagram form, another more detailed implementation of the reference current generator circuit according to the invention shown in FIG. 4.

In accordance with our disclosure, the closely separated voltages, $V_{top}$ 24 and $V_{bot}$ 26, each drive a buffer amplifier, illustrated in FIG. 4, FIG. 5 and FIG. 7 as top buffer 32 and bottom buffer 34, respectively. It is therefore desirable to select $V_{top}$ 24 and $V_{bot}$ 26 having values substantially greater than the ground potential and substantially less than the supply voltage. This has the desired effect of biasing each buffer amplifier in a high gain region.

Figure 9:
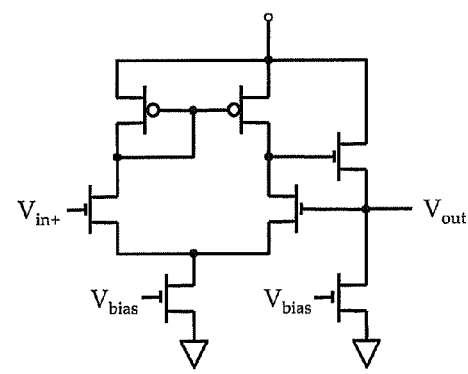
FIG. 9 illustrates, in block diagram form, a known common drain amplifier, configured to operate in a unity gain mode, suitable for use in the several embodiments of my reference current generator.

Top buffer 32 comprises two stages with a first stage comprising amplifier circuit 46 and a second stage comprising NMOS device 48. Amplifier circuit 46 may be implemented using techniques well known to one of ordinary skill in this art such as those mentioned previously that may include exemplary circuits such as a common drain amplifier, also known as a source follower, or a more complex circuit such as a differential amplifier connected in a unity gain configuration as illustrated in FIG. 9. Amplifier circuit 46 is configured to use negative feedback to force the source of NMOS device 48 to be the same voltage as $V_{top}$ 24 at the positive input of amplifier circuit 46. Amplifier circuit 46 regulates the voltage at the gate of NMOS device 48 so as to maintain a substantially constant voltage at the source of NMOS device 48 that is substantially equivalent to $V_{top}$ 24.

Bottom buffer 34, similar to top buffer 32, comprises two stages with a first stage comprising amplifier circuit 50 and a second stage comprising PMOS device 52. Again, amplifier circuit 50 is configured to use negative feedback. Bottom buffer 34 is distinguishable from top buffer 32 by the use a PMOS device and using the negative feedback to force the source of PMOS device 52 to be the same voltage as $V_{bot}$ 26 at the positive input of amplifier circuit 50. Amplifier circuit 50 regulates the voltage at the gate of PMOS device 52 so as to maintain a substantially constant voltage at the source of PMOS device 52 that is substantially equivalent to $V_{bot}$ 26. Thus buffered versions of $V_{top}$ 24 and $V_{bot}$ 26 are applied across resistive element 28.

Resistive element 28 must provide a very large impedance (typically >1 MΩ) to ensure minimum power, and should have a relatively small and largely linear temperature sensitivity to permit temperature compensation. A transistor can be used as a resistive element and can achieve very high impedance if biased in the sub-threshold region. However, transistors tend to have large non-linear sensitivity to temperature. Polysilicon resistors are more attractive since they can be made with reasonably high impedance and with small and relatively linear temperature sensitivity. For example, a 10MΩ P-type polysilicon resistor can be manufactured in a 0.18 μm process with a chip area much less than 0.5 mm².

Figure 6:
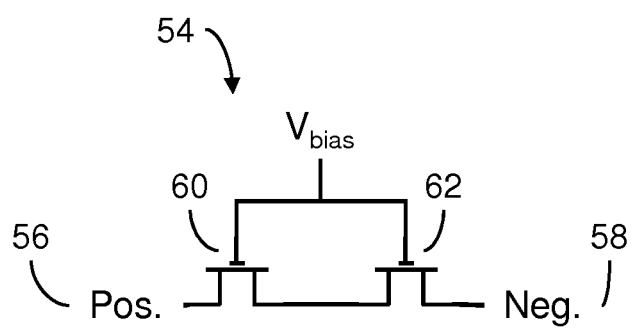
FIG. 6 illustrates, in block diagram form, an exemplary transistor-based resistive element used in the embodiments of the reference current generator according to the disclosures illustrated in FIG. 3, FIG. 4, FIG. 5, and FIG. 7.

Resistive element 28 can also be implemented in a smaller area using various transistor-based topologies that have current-voltage characteristics similar to that of a resistor. Such a transistor-based topology 54 is illustrated in FIG. 6 in accordance with an embodiment of our disclosure. Transistor-based topology 54 is capable of generating a very high impedance device that behaves like a resistor between terminals "pos" 56 and "neg" 58. Resistive element 28 may be implemented in a small area and with minimum power if NMOS device 60 and NMOS device 62 are biased in the sub-threshold region. However, it should be noted that linearity would generally not match the linearity typically achieved by a traditional resistor, such as the polysilicon resistor discussed previously.

FIG. 7 illustrates another detailed embodiment of our reference current generator 64. Reference current generator 64 contains voltage difference generator 66 which, as previously disclosed, generates two closely separated voltages, $V_{top}$ 24 and $V_{bot}$ 26. As previously disclosed, the closely separated voltages, $V_{top}$ 24 and $V_{bot}$ 26, each drive a buffer amplifier, specifically top buffer 32 and bottom buffer 34, respectively. Top buffer 32 and bottom buffer 34 likewise operate as previously disclosed. In addition to the previously discussed series-connected diode-connected transistor stack, voltage difference generator 66 includes a two-transistor reference voltage generator, represented by NMOS transistors 68 and 70, and a voltage buffer 72. The two-transistor reference voltage generator supplies a substantially stable supply voltage for the series-connected diode-connected transistor stack. NMOS device 70 and NMOS device 68 operate in weak inversion mode or the sub-threshold region, thus dramatically reducing power consumption as compared to existing designs. A stable supply voltage may be generated using techniques well known to one of ordinary skill in this art, including circuits containing variants of the two-transistor reference voltage generator described in U.S. patent application Ser. No. 12/823,160, herein incorporated by reference in its entirety. Voltage buffer amplifier 72 receives the substantially stable supply voltage generated by the aforementioned two-transistor reference voltage generator, and drives the supply voltage input of the voltage ladder, thus isolating the load of the voltage ladder from the reference voltage generator. Voltage buffer amplifier 72 may be designed using any of the well-known techniques, including the techniques disclosed herein. However, in order to minimize power, it is typically desirable to use circuit topologies with sub-threshold-biased transistors. Likewise, for isolation and performance reasons, it is typically desirable to use circuits with high impedance inputs and low impedance output typically associated with these types of buffer amplifiers. FIG. 7 also illustrates current mirror 74. Resistive element 28 is placed in series with diode-connected PMOS device 76 that in turn, mirrors the reference current $I_{ref}$ to PMOS device 78. One of ordinary skill in this art will appreciate that current mirror 74 may be one of many different variants; though sub-threshold-biased transistors will typically be used to minimize associated power.

When designing a reference current generator, it is often desirable to tune the temperature sensitivity of the reference current to a target value. It is typically desirable to minimize temperature sensitivity though it can also be useful to have current follow a proportional-to-absolute temperature (PTAT) characteristic or a complementary-to-absolute temperature (CTAT) characteristic. The chip designer may change the temperature sensitivity of several design variables to achieve desired temperature sensitivity. For example, resistive element 28 illustrated in FIG. 6 may be selected based on its temperature sensitivity. As is known, the impedance of some resistors increases with temperatures while others have impedance that decreases with temperature. Alternatively, the temperature sensitivity of $V_{top}$ 24-$V_{bot}$ 26 illustrated in FIG. 3, FIG. 4, FIG. 5 and FIG. 7 is highly linear and may be changed from CTAT to PTAT simply by resizing the diode-connected transistors in the stack. A similar change in temperature sensitivity can be achieved by resizing NMOS transistors 68 and 70 of the two-transistor reference voltage generator illustrated FIG. 7. One of ordinary skill in this area of art will appreciate that the aforementioned PTAT and CTAT adaptations are exemplary of the continuum of methods by which circuits such as those described herein may be adjusted to have current follow a PTAT or CTAT characteristic. The temperature sensitivity of the buffers and current mirror structure may also be changed to achieve target temperature sensitivity. One of ordinary skill in this art may use a combination of the aforementioned design techniques along with other known techniques to achieve desired temperature sensitivity.

A first-generation prototype of an oscillator is described in the unpublished manuscript titled "A 0.9%/V, 82 ppm/° C., 25.5 nW CMOS Oscillator for Ultra-Low Power Sensing Systems," the subject matter of which, in its entirety, is expressly incorporated herein by reference. The oscillator consumes only 25 nW and has temperature sensitivity of only 82 ppm/° C. over the temperature range T=0° C. to T=40° C., making it an ultra-low power alternative to today's generation of on-chip oscillators. Our second-generation prototype oscillator operates with current draw of approximately 1 nA.

Thus it is apparent that we have provided an improved method and apparatus for an ultra-low power temperature compensated reference current generator. In particular, we submit that our method and apparatus provides performance generally comparable to the best prior art techniques while requiring less circuitry and consuming less power that known implementations of such prior art techniques. Therefore, we intend that our disclosure encompass all such variations and modifications as fall within the scope of the appended claims.

What we claimed is:

1. A circuit for generating a reference current, said circuit comprising:
   a voltage difference generator configured to receive an input voltage and operable to supply a first voltage and a second voltage with a difference between them and derived from the input voltage, where the first voltage and the second voltage have predefined values that are substantially insensitive to changes in the input voltage, said voltage difference generator comprising:
   a reference voltage generator adapted to supply a first supply voltage;
   a voltage buffer amplifier electrically coupled to said first supply voltage and adapted to provide a second supply voltage; and
   a voltage ladder electrically coupled to said second supply voltage and adapted to supply said first voltage and said second voltage;
   a first buffer electrically coupled to said first voltage, said first buffer being adapted to supply a third voltage, said first buffer comprising:
   a first amplifier adapted to:
   receive said first voltage;
   receive said third voltage; and
   compare said first voltage to said third voltage, and, in response, to output a first control voltage; and
   a first transistor device adapted to receive said first control voltage, and, in response, to supply said third voltage;
   a second buffer electrically coupled to said second voltage, said second buffer being adapted to supply a fourth voltage, said second buffer comprising:
   a second amplifier adapted to:
   receive said second voltage;
   receive said fourth voltage; and
   compare said second voltage to said fourth voltage, and, in response, to output a second control voltage; and
   a second transistor device adapted to receive said second control voltage, and, in response, to supply said fourth voltage; and
   a resistive element having a substantially linear operating behavior and electrically coupled between said third voltage and said fourth voltage, said resistive element being adapted to generate a reference current that is a function of said third voltage and said fourth voltage; and
   a current mirror electrically connected in series with the resistive element, said current mirror being adapted to mirror the reference current, wherein the first buffer, the second buffer and the current mirror are comprised of transistors operating solely in a sub-threshold region.

2. The circuit of claim 1 wherein said first voltage and said second voltage are further characterized as being closely separated.

3. The circuit of claim 1 wherein said reference voltage generator is further characterized as comprising a plurality of transistor devices operating in a sub-threshold region.

4. The circuit of claim 3 wherein said plurality of transistor devices is further characterized as a plurality of a selected one of NMOS transistor devices or PMOS transistor devices.

5. The circuit of claim 1 wherein said voltage buffer amplifier is further characterized as comprising a plurality of transistor devices operating in a sub-threshold region.

6. The circuit of claim 1 wherein said voltage ladder is further characterized as comprising a plurality of series connected resistive circuit elements operating in a sub-threshold region.

7. The circuit of claim 6 wherein said plurality of series-connected resistive circuit elements is further characterized as a selected one of diode-connected NMOS devices or diode-connected PMOS devices.

8. The circuit of claim 1 wherein said resistive element is further characterized as a plurality of transistors operating in a sub-threshold region.

9. The circuit of claim 8 wherein said plurality of transistors is further characterized as comprising a selected one of NMOS or PMOS devices.

10. The circuit of claim 1 wherein at least a selected one of said voltage difference generator, said first buffer, said second buffer, and said resistive element are tuned to achieve at least a selected one of minimum temperature sensitivity, proportional-to-absolute temperature characteristic, and complementary-to-absolute temperature characteristic.

11. A circuit for generating a reference current, said circuit comprising:
  a voltage difference generator configured to receive a single input voltage and operable to supply a first voltage and a second voltage with a difference between them and derived from the input voltage, where the first voltage and the second voltage have predefined values that are substantially insensitive to changes in the input voltage;
  a first analog voltage buffer electrically coupled to said first voltage and operating at a first gain value to supply a third voltage, where the third voltage is derived as a function of the first voltage and the first gain value;
  a second analog voltage buffer electrically coupled to said second voltage and operating at a second gain value to supply a fourth voltage, where the fourth voltage is derived as a function of the second voltage and the second gain value;
  a resistive element having a substantially linear operating behavior and electrically coupled between said third voltage and said fourth voltage, said resistive element being adapted to generate a reference current that is a function of said third voltage and said fourth voltage; and
  a current mirror electrically connected in series with the resistive element, said current mirror being adapted to mirror the reference current, wherein the first analog voltage buffer, the second analog voltage buffer and the current mirror are comprised of transistors operating solely in a sub-threshold region.

12. The circuit of claim 11 wherein said voltage difference generator is further characterized as comprising:
  a reference voltage generator adapted to supply a first supply voltage;
  a voltage buffer amplifier electrically coupled to said first supply voltage and adapted to provide a second supply voltage; and
  a voltage ladder electrically coupled to said second supply voltage and adapted to supply said first voltage and said second voltage.

13. The circuit of claim 12 wherein said first buffer is further characterized as comprising:
  a first amplifier adapted to:
    receive said first voltage;
    receive said third voltage; and
    compare said first voltage to said third voltage, and, in response, to output a first control voltage; and
  an NMOS device adapted to receive said first control voltage, and, in response, to supply said third voltage.

14. The circuit of claim 13 wherein said second buffer is further characterized as comprising:

a second amplifier adapted to:
    receive said second voltage;
    receive said fourth voltage; and
    compare said second voltage to said fourth voltage, and, in response, to output a second control voltage; and
  a PMOS device adapted to receive said second control voltage, and, in response, to supply said fourth voltage.

15. The circuit of claim 14 wherein said second amplifier is further characterized as comprising a plurality of transistor devices operating in a sub-threshold region.

16. The circuit of claim 14 wherein said second transistor device is further characterized as operating in a sub-threshold region.

17. The circuit of claim 13 wherein said first amplifier is further characterized as comprising a plurality of transistor devices operating in a sub-threshold region.

18. The circuit of claim 13 wherein said first transistor device is further characterized as operating in a sub-threshold region.

19. The circuit of claim 12 wherein said reference voltage generator is further characterized as comprising a plurality of transistor devices operating in a sub-threshold region.

20. The circuit of claim 19 wherein said plurality of transistor devices is further characterized as a plurality of a selected one of NMOS transistor devices or PMOS transistor devices.

21. The circuit of claim 12 wherein said voltage buffer amplifier is further characterized as comprising a plurality of transistor devices operating in a sub-threshold region.

22. The circuit of claim 12 wherein said voltage ladder is further characterized as comprising a plurality of series-connected resistive circuit elements operating in a sub-threshold region.

23. The circuit of claim 22 wherein said plurality of series-connected resistive circuit elements is further characterized as a selected one of diode-connected NMOS devices or diode connected PMOS devices.

24. The circuit of claim 11 wherein said first voltage and said second voltage are further characterized as being closely separated.

25. The circuit of claim 11 wherein said resistive element is further characterized as a plurality of transistors operating in a sub-threshold region.

26. The circuit of claim 25 wherein said plurality of transistors is further characterized as comprising a selected one of NMOS or PMOS devices.

27. The circuit of claim 11 wherein at least a selected one of said voltage difference generator, said first buffer, said second buffer, and said resistive element are tuned to achieve at least a selected one of minimum temperature sensitivity, proportional-to-absolute temperature characteristic, and complementary-to-absolute temperature characteristic.

28. A circuit for generating a reference current, said circuit comprising:
  a voltage difference generator configured to receive a single input voltage and operable to supply a first voltage and a second voltage with a difference between them and derived from the input voltage, where the first voltage and the second voltage have predefined values that are substantially insensitive to changes in the input voltage;
  a first analog voltage buffer electrically coupled to said first voltage and operating at a first gain value to supply a third voltage, where the third voltage is derived as a function of the first voltage and the first gain value;
  a second analog voltage buffer electrically coupled to said second voltage and operating at a second gain value to supply a fourth voltage, where the fourth voltage is derived as a function of the second voltage and the second gain value;

a resistive element having a substantially linear operating behavior and electrically coupled between said third voltage and said fourth voltage, said resistive element being adapted to generate a reference current that is a function of said third voltage and said fourth voltage; and a current mirror electrically coupled in series with the resistive element, said current mirror being adapted to mirror the reference current, wherein the voltage difference generator, the first analog voltage buffer and the second analog voltage buffer are comprised of transistors operating solely in a sub-threshold region.

* * * * *